United States Patent
Kurisawa et al.

(10) Patent No.: US 11,614,496 B2
(45) Date of Patent: Mar. 28, 2023

(54) DETERMINATION METHOD, DETERMINATION DEVICE, MAINTENANCE SUPPORT SYSTEM, AND COMPUTER PROGRAM

(71) Applicant: GS Yuasa International Ltd., Kyoto (JP)

(72) Inventors: Isamu Kurisawa, Kyoto (JP); Osamu Kashima, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 0 days.

(21) Appl. No.: 17/621,031

(22) PCT Filed: Jun. 17, 2020

(86) PCT No.: PCT/JP2020/023665
§ 371 (c)(1),
(2) Date: Dec. 20, 2021

(87) PCT Pub. No.: WO2020/255981
PCT Pub. Date: Dec. 24, 2020

(65) Prior Publication Data
US 2022/0268849 A1    Aug. 25, 2022

(30) Foreign Application Priority Data

Jun. 20, 2019 (JP) .............................. JP2019-114666
Aug. 28, 2019 (JP) .............................. JP2019-156001

(51) Int. Cl.
G01R 31/392    (2019.01)
G01R 31/389    (2019.01)
H02J 7/00      (2006.01)

(52) U.S. Cl.
CPC ......... *G01R 31/392* (2019.01); *G01R 31/389* (2019.01); *H02J 7/005* (2020.01); *H02J 7/00041* (2020.01)

(58) Field of Classification Search
None
See application file for complete search history.

(56) References Cited

U.S. PATENT DOCUMENTS

2006/0202857 A1* 9/2006 Kawahara ............. H02J 7/0047
                                                      340/870.02
2013/0030739 A1* 1/2013 Takahashi ............ G01R 31/396
                                                      702/63

(Continued)

FOREIGN PATENT DOCUMENTS

JP    2003-123847 A    4/2003
JP    2004-126669 A    4/2004

(Continued)

OTHER PUBLICATIONS

International Searching Authority, International Search Report and Written Opinion for International Application No. PCT/JP2020/023665, dated Sep. 1, 2020, (11 pages), Japan Patent Office, Tokyo, Japan.

(Continued)

*Primary Examiner* — Jas A Sanghera
(74) *Attorney, Agent, or Firm* — Alston & Bird LLP

(57) ABSTRACT

This decision method: determines whether measurement data pertaining to a plurality of power storage elements included in a system is periodically stored in a storage device; when the measurement data is determined as stored, determines, on the basis of the acquired measurement data, whether each of the plurality of power storage elements reaches the end of life within a period corresponding to a standard use period at a prescribed temperature; and decides (Continued)

that a power storage element determined as reaching the end of life is required to be replaced.

9 Claims, 6 Drawing Sheets

(56) References Cited

U.S. PATENT DOCUMENTS

| | | |
|---|---|---|
| 2014/0285156 A1 | 9/2014 | Mukaitani et al. |
| 2014/0306667 A1 | 10/2014 | Mukaitani et al. |
| 2014/0312915 A1 | 10/2014 | Mukaitani et al. |
| 2016/0091573 A1 | 3/2016 | Shiraishi et al. |
| 2018/0222343 A1* | 8/2018 | Uchida .............. G06Q 30/0601 |

FOREIGN PATENT DOCUMENTS

| | | |
|---|---|---|
| JP | 2006-080032 A | 3/2006 |
| JP | 2016-070920 A | 5/2016 |
| WO | WO-2013/069328 A1 | 5/2013 |

OTHER PUBLICATIONS

International Searching Authority, International Search Report and Written Opinion for International Application No. PCT/JP2020/023665, dated Sep. 1, 2020, (8 pages), Japan Patent Office, Tokyo, Japan, English Translation of International Search Report.

* cited by examiner

DETERMINATION METHOD, DETERMINATION DEVICE, MAINTENANCE SUPPORT SYSTEM, AND COMPUTER PROGRAM

CROSS REFERENCE TO RELATED APPLICATIONS

This application is a national stage application, filed under 35 U.S.C. § 371, of International Application No. PCT/JP2020/023665, filed Jun. 17, 2020, which international application claims priority to and the benefit of Japanese Application No. 2019-156001, filed Aug. 28, 2019 and Japanese Application No. 2019-114666, filed Jun. 20, 2019; the contents of all of which as are hereby incorporated by reference in their entireties.

BACKGROUND

Technical Field

The present invention relates to a determination method, a determination device, a maintenance support system, and a computer program relating to replacement of an energy storage device for realizing a long-term guarantee of a system including the energy storage device.

Description of Related Art

An energy storage device is widely used in an uninterruptible power system, a DC or AC power supply device included in a stabilized power supply, and the like. The use of energy storage devices in large-scale systems that store renewable energy or power generated by an existing power generating system is also expanding.

An energy storage device has a life. A lifetime of an energy storage device for industrial use is often ten years or more, and a long life is expected by a manufacturer of the energy storage device as well as an owner who purchases and operates the energy storage device. However, a secondary battery such as a lead-acid battery or a lithium battery may be forced to be replaced in a period shorter than an expected life because an environmental temperature greatly affects the life.

Patent Document JP-A-2016-070920 discloses a method of appropriately determining a life of an energy storage device in consideration of a temperature of a use environment.

BRIEF SUMMARY

In a case where data of a use environment of an energy storage device can be checked, a life of the energy storage device can accurately be calculated. Even if a life of each energy storage device can be accurately calculated in a system in which a large number of energy storage devices are connected and used, if replacement work is performed for a life of each energy storage device, maintenance cost is required for each replacement work, and work of a person in charge of maintenance also increases. Such maintenance is burdensome for an owner and requires many human resources as a person in charge of maintenance. It is desirable to guarantee that an owner can use a system including an energy storage device for a longer time with security based on the fact that a life of the energy storage device can be accurately calculated.

An object of the present invention is to provide a determination method, a determination device, a maintenance support system, and a computer program for realizing a long-term guarantee of a system including an energy storage device.

A determination method determines whether or not measurement data relating to a plurality of energy storage devices included in a system (power supply-related device) is periodically stored in a storage device, determines whether or not each of the energy storage devices reaches end of its life within a period corresponding to a standard use period at a predetermined temperature based on acquired measurement data in a case where measurement data is determined to be stored, and determines that replacement is necessary for an energy storage device that is determined to reach end of its life.

DETAILED DESCRIPTION OF VARIOUS EMBODIMENTS

Figure 1:
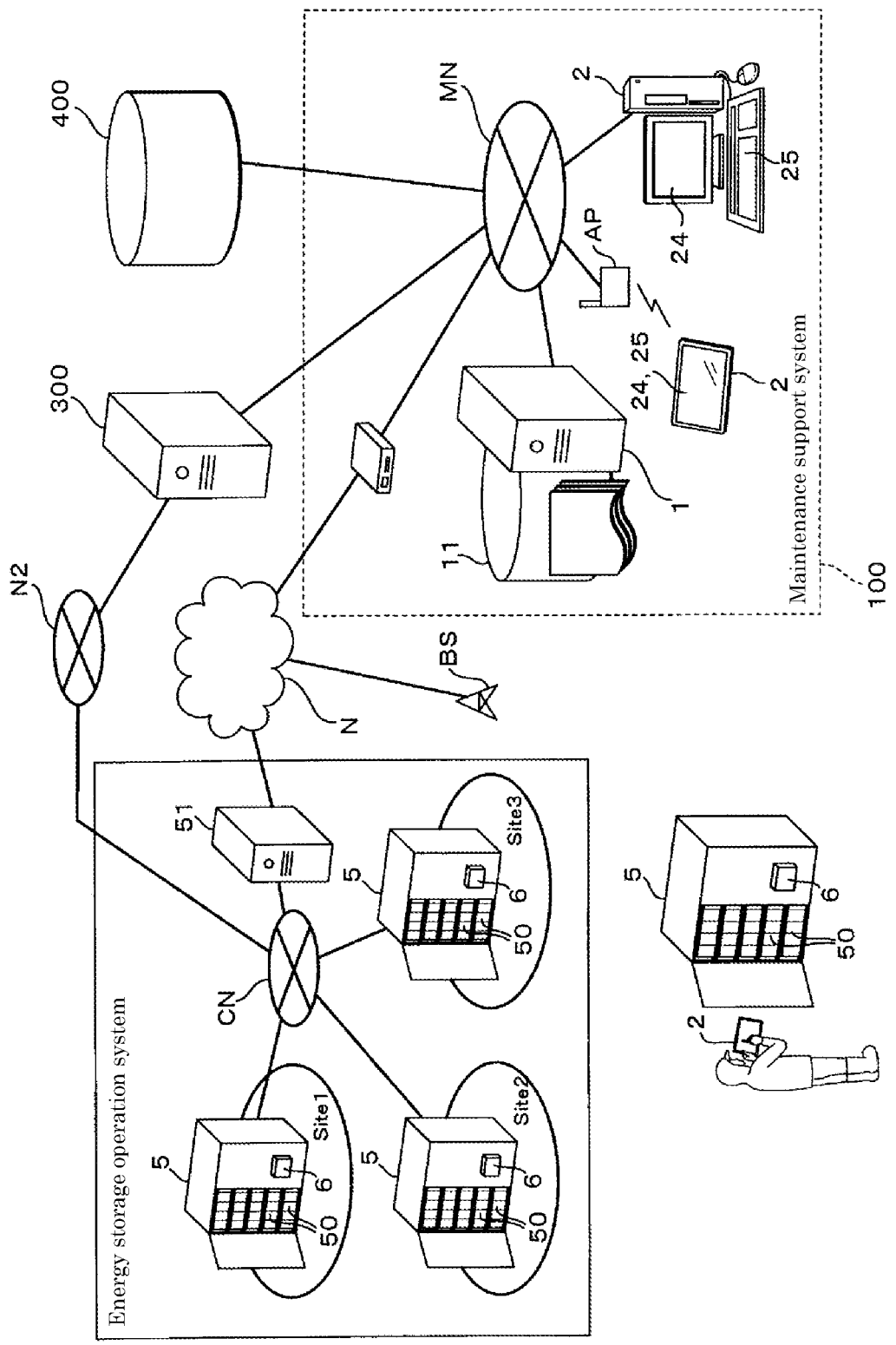
FIG. 1 illustrates an outline of a maintenance support system.

A determination method includes determining whether or not measurement data relating to a plurality of energy storage devices included in a system is periodically stored in a storage device, determining whether or not each of the energy storage devices reaches end of its life within a period corresponding to a standard use period at a predetermined temperature based on acquired measurement data in a case where measurement data is determined to be stored, and determining that replacement is necessary for an energy storage device that is determined to reach end of its life.

It is determined whether or not replacement is necessary on condition that measurement data is periodically stored, and can be acquired. Not only an energy storage device that has already reached the end of its life at the time point of determination, but also an energy storage device that reaches the end of its life within a use period after the time point of determination is determined to be required to be replaced. An energy storage device which is expected to be required to be replaced with a high probability is replaced with another energy storage device even if the life of the energy storage device remains, so that it is possible to suppress the number of times of replacement work. For an owner, work cost required for each replacement work of an energy storage device can be suppressed. Since the determination method that is advantageous for an owner is based on the condition that measurement data can be acquired, a manufacturer can avoid the risk of guaranteeing an energy storage device whose use environment is unknown, and long-term guarantee can be made.

It may be determined whether or not the number of energy storage devices determined to reach the end of their lives is equal to or more than a predetermined ratio of the number of all energy storage devices included in the system. It may be determined that replacement is necessary for the energy storage device determined to reach the end of its life in a case where the number of energy storage devices determined to reach end of their lives is determined to be less than the predetermined ratio, and it may be determined that replacement is necessary for all the energy storage devices included in the system in a case where the number of energy storage devices determined to reach the end of their lives is determined to be equal to or more than the predetermined ratio.

With the above configuration, it is possible to use energy storage devices having the same electrical characteristics in a well-balanced manner. It is possible to maintain the performance of the entire system for a long period of time as compared with a case where an energy storage device close to the end of its life and a new energy storage device are mixed. Long-term guarantee can be made by appropriately determining a replacement time.

The energy storage device is, for example, a lead-acid battery. Whether or not the energy storage device reaches the end of its life is determined based on accumulated data related to transition of an internal resistance value in a use period of a lead-acid battery at a predetermined temperature by using an internal resistance value included in the measurement data in a case where the energy storage device is a lead-acid battery.

For example, for a lead-acid battery having a long life of more than ten years, the life can be accurately estimated by using accumulated data related to transition of an internal resistance value during a use period of the lead-acid battery at a predetermined temperature. By appropriately determining a replacement time, it is possible to make a long-term guarantee while maintaining the performance of the system.

A use period up to a time point at which the measurement data of the lead-acid battery is acquired may be estimated, and the determination may be executed based on the estimated use period. The use period may be derived by converting an internal resistance value included in the measurement data into an internal resistance value at the predetermined temperature. Alternatively, the use period may be derived by converting transition of an internal resistance value in a use period of the lead-acid battery at the predetermined temperature into transition of an internal resistance value in temperature data based on the temperature data included in the measurement data.

A use period is estimated depending on to which time in transition of an internal resistance value a value obtained by correcting an internal resistance value measured at a temperature of a use environment to an internal resistance value at a predetermined temperature corresponds. Alternatively, transition of an internal resistance value with respect to a use period at a predetermined temperature accumulated in advance is converted into transition in a case of use at an average temperature in a use environment of a target energy storage device, and a use period is estimated depending on to which time in the transition an internal resistance value included in the measurement data corresponds. In any method, whether or not an energy storage device reaches the end of its life is accurately determined.

A determination device includes a first determination unit that determines whether or not measurement data relating to a plurality of energy storage devices included in a system is periodically stored in a storage device, a second determination unit that determines whether or not each of a plurality of the energy storage devices reaches the end of its life within a period corresponding to a standard use period at a predetermined temperature based on acquired measurement data in a case where measurement data is determined to be stored, and the third determination unit that determines that replacement is necessary for an energy storage device that is determined to reach the end of its life.

The determination method may be applied to a maintenance support system. The maintenance support system includes a storage device that periodically acquires and sequentially stores measurement data relating to an energy storage device included in the system, a maintenance terminal device used by a person in charge of maintenance of the energy storage device, and a maintenance support device to which communication connection can be established from the maintenance terminal device. In the maintenance support system, the maintenance support device determines whether or not measurement data relating to a plurality of energy storage devices included in the system is periodically stored in the storage device. The maintenance support device determines whether or not each of a plurality of the energy storage devices reaches the end of its life within a period corresponding to a standard use period at a predetermined temperature based on acquired measurement data in a case where measurement data is determined to be stored, determines that replacement is necessary for an energy storage device that is determined to reach the end of its life, and notifies the maintenance terminal device of a determination result.

With the above configuration, a person in charge of maintenance can recognize an energy storage device that needs to be replaced as soon as possible and an energy storage device that is expected to need to be replaced with high probability collectively (energy storage devices to which replacement work is to be performed collectively) on the maintenance terminal device.

The determination method may be implemented as a computer program. The computer program causes a computer to execute processing of determining whether or not measurement data relating to a plurality of energy storage devices included in a system is periodically stored in a storage device. In a case where it is determined that the measurement data is stored, the computer program causes a computer to execute processing of determining, based on the acquired measurement data, whether or not each of a plurality of the energy storage devices reaches the end of its life within a period corresponding to a standard use period at a predetermined temperature, and determining that replacement is necessary for the energy storage device determined to reach the end of its life.

Hereinafter, the present invention will be specifically described with reference to the drawings illustrating an embodiment of the present invention.

FIG. 1 illustrates an outline of a maintenance support system 100. The maintenance support system 100 includes a maintenance support device 1 and a maintenance terminal device 2 used by a person in charge of maintenance. The maintenance support system 100 is communicably connectable to a remote monitoring system 300 that collects data indicating a state of an energy storage device 50 to be maintained and realizes remote state browsing based on data collected via a network. The maintenance support system 100 is communicably connectable to a customer data management system 400 that stores data of a customer who purchases an energy storage device to be maintained. In the present embodiment, the maintenance support system 100, the remote monitoring system 300, and the customer data management system 400 are managed by a manufacturer of the energy storage device 50 to be maintained, and can be communicably connected to each other via a network MN or a dedicated line for the manufacturer. The maintenance support system 100 may be communicably connectable to a manufacturing management system (not illustrated) of the energy storage device 50.

The network MN is a local network for a manufacturer. The network MN is, for example, Ethernet (registered trademark) and may be an optical line. The network MN may include a virtual private network (VPN), and connect the systems 100, 300, and 400 in different locations as a local network. Connection between the maintenance support system 100 and the remote monitoring system 300 and connection between the maintenance support system 100 and the customer data management system 400 may be a part of the network MN, a dedicated line, or a VPN.

The maintenance terminal device 2 and the maintenance support device 1 can be communicably connected via a communication network N or the network MN. The communication network N is what is called the Internet. The communication network N may include a carrier network that realizes wireless communication according to a predetermined mobile communication standard. The communication network N may include a general optical line.

The energy storage device 50 to be maintained by the maintenance support system 100 is preferably a chargeable energy storage device such as a secondary battery including a lead-acid battery and a lithium ion battery or a capacitor. A part of the energy storage device 50 may be a non-chargeable primary battery. Each of the energy storage devices 50 in the present embodiment is a lead-acid battery.

An energy storage apparatus 5 of the present embodiment includes a plurality of the energy storage devices 50. In one example, the energy storage apparatus 5 is used alone. The energy storage apparatus 5 is used as a backup power source. In another example, the energy storage apparatus 5 is used as a group of the energy storage apparatuses 5 communicably connected to a network CN of a customer managed by a customer (user) of the energy storage device 50. A group of the energy storage apparatuses 5 managed by the same customer transmit state data of the energy storage device 50 to a management apparatus 51 managed by the customer via the network CN of the customer. The state data includes at least a voltage value, an internal resistance value, and a temperature. The state data may include a current value. The state data is transmitted from a unit connected to a terminal of the energy storage device 50 which is a lead-acid battery via a maintenance communication device 6. The state data may be transmitted from the maintenance communication device 6 to the maintenance terminal device 2. The state data transmitted from a plurality of the energy storage apparatuses 5 is transmitted to the remote monitoring system 300 via a dedicated line N2 or the communication network N, and a state history is stored in association with identification data such as a serial number for identifying each of the energy storage devices 50.

The energy storage apparatus 5 is provided with the maintenance communication device 6 capable of exchanging data with the maintenance terminal device 2 used by a person in charge of maintenance without using the network CN. The maintenance communication device 6 is communicably connectable to a unit that acquires state data of each of the energy storage devices 50 of the energy storage apparatus 5. The maintenance communication device 6 according to the present embodiment is communicably connectable to a unit connected to a terminal of a lead-acid battery by wireless communication. The maintenance communication device 6 stores state data identical to state data transmitted from the energy storage apparatus 5 to the management apparatus 51 in a built-in memory.

The network CN is a local network of a customer who operates a plurality of the energy storage apparatuses 5. The network CN is, for example, Ethernet (registered trademark), and may be an optical line. The network CN may include a VPN. The network CN may be an ECHONET/ECHONETLite compatible network. The dedicated line N2 is a private network that connects a customer of the energy storage apparatus 5 and the remote monitoring system 300. The dedicated line N2 may be the communication network N. The dedicated line N2 may be a dedicated network compatible with ECHONET/ECHONETLite.

The customer data management system 400 stores attribute data such as a name or a name of a customer, a contact address of the customer, and an address in association with a customer ID. When a customer installs and manages a plurality of energy storage apparatuses 5 in different locations, the customer data management system 400 stores sites in association with location IDs for identifying the locations. The customer data management system 400 stores identification data of the energy storage device 50 purchased by a customer in association with the customer ID. In a case where a customer installs and manages a plurality of the energy storage apparatuses 5 in different locations, the customer data management system 400 stores identification data of the installed energy storage device 50 in association with the customer ID and the location ID.

The remote monitoring system 300 sequentially stores state data of the energy storage device 50 in association with identification data of the energy storage device 50. The remote monitoring system 300 acquires and stores an operation start date in association with the identification data of the energy storage device 50, and stores a manufacturing date that can be acquired from the manufacturing management system. The remote monitoring system 300 may derive, for each of the energy storage devices 50, diagnostic data including a state of charge (SOC), a state of health (SOH), an estimated life, and the like of each of the energy storage devices 50 based on the state data.

The manufacturing management system (not illustrated) stores a manufacturing date, a lot number, and shipping date and time in association with identification data such as a serial number of each of the energy storage devices 50 (that is, lead-acid batteries).

The maintenance support system 100 according to the present embodiment calculates a life time of each of the energy storage devices 50 included in the energy storage apparatus 5 on a condition that state data can be continuously acquired during an operation period of the energy storage device 50, determines necessity of replacement of the energy storage device 50, and notifies a person in charge of maintenance when the replacement is necessary. The necessity of replacement is determined for each battery cell in consideration of a life time of the target energy storage apparatus 5 as a whole. This makes it possible to guarantee performance of the energy storage apparatus 5 as a backup power supply while minimizing the number of times of replacement work.

A detailed configuration for realizing the maintenance support system 100 for the energy storage device 50 will be described.

Figure 2:
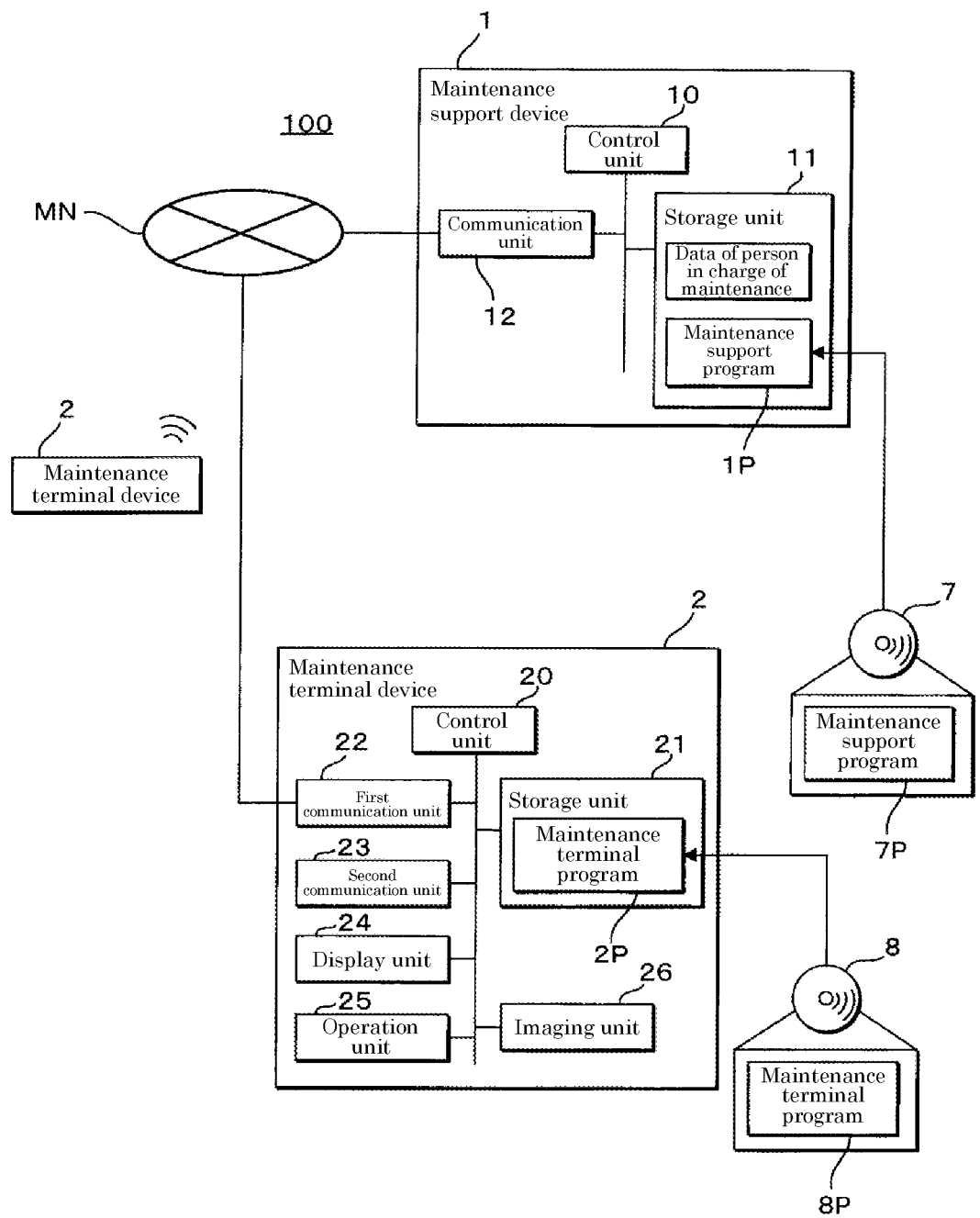
FIG. 2 is a block diagram illustrating an internal configuration of a device included in the maintenance support system.

FIG. 2 is a block diagram illustrating an internal configuration of a device included in the maintenance support system 100. The maintenance support device 1 uses a server computer and includes a control unit 10, a storage unit 11, and a communication unit 12. In the present embodiment, the maintenance support device 1 is described as one server computer. However, processing may be distributed among a plurality of server computers.

The control unit 10 is a processor using a central processing unit (CPU) or a graphics processing unit (GPU), and executes processing by controlling each component using a built-in memory such as a ROM and a RAM. The control unit 10 executes processing based on a maintenance support program 1P stored in a storage unit 21. The maintenance support program 1P includes a web server program, and the control unit 10 functions as a web server that executes provision of a web page to the maintenance terminal device 2.

The storage unit 11 is, for example, a non-volatile memory such as a hard disk or a solid state drive (SSD). The storage unit 11 stores the maintenance support program 1P described above. The maintenance support program 1P stored in the storage unit 11 may be one that is obtained by the control unit 10 reading a maintenance support program 7P stored in a recording medium 7 and copied to the storage unit 11. The storage unit 11 stores data that the control unit 10 refers to in calculation of a life time and determination of necessity of replacement. The storage unit 11 stores data of a person in charge including an ID of a person in charge of maintenance. The data of a person in charge includes contact information such as a name of the person in charge and an e-mail address in association with an ID of the person in charge.

The communication unit 12 is a communication device that realizes communication connection and data transmission and reception via the network MN. Specifically, the communication unit 12 is a network card that supports the network MN. The communication unit 12 may realize communication via the communication network N via a router device (not illustrated) connected to the network MN. The control unit 10 transmits and receives data to and from the remote monitoring system 300 and the customer data management system 400 by the communication unit 12.

The maintenance terminal device 2 is a computer used by a person in charge of maintenance. The maintenance terminal device 2 may be a desktop or laptop personal computer, or what is called a smartphone or tablet communication terminal. The maintenance terminal device 2 may be a head mounted display or a glass-type wearable terminal device capable of outputting a visual instruction. The maintenance terminal device 2 includes a control unit 20, a storage unit 21, a first communication unit 22, a second communication unit 23, a display unit 24, and an operation unit 25. The maintenance terminal device 2 may include an imaging unit 26 as illustrated.

The control unit 20 is a processor using a CPU or a GPU. The control unit 20 causes the display unit 24 to display a repair procedure based on a maintenance terminal program 2P stored in the storage unit 21. The control unit 20 executes processing of reading state data from the maintenance communication device 6 and information processing with the maintenance support device 1.

The storage unit 21 is, for example, a non-volatile memory such as a hard disk or a flash memory. The storage unit 21 stores various programs including the maintenance terminal program 2P. The maintenance terminal program 2P may be one that is obtained by the control unit 20 reading a maintenance terminal program 8P stored in a recording medium 8 and copied to the storage unit 21.

The first communication unit 22 is a communication device for realizing data communication via the communication network N or the network MN. The first communication unit 22 uses a communication device such as a network card for wired communication, a wireless communication device for mobile communication connected to a base station BS (see FIG. 1), or a wireless communication device that supports connection to an access point AP.

The second communication unit 23 is a communication device for realizing data communication by being communicably connected to the maintenance communication device 6. The second communication unit 23 may be a wireless communication device of Wi-Fi, Bluetooth (registered trademark), or the like. The second communication unit 23 may be a universal serial bus (USB) interface.

As the display unit 24, a display such as a liquid crystal display or an organic electro luminescence (EL) display is used. The display unit 24 displays an operation screen based on the maintenance terminal program 2P of the control unit 20 and an image of a web page provided by the maintenance support device 1. The display unit 24 is preferably a display incorporating a touch panel, but may be a display not incorporating a touch panel.

The operation unit 25 is a keyboard and a pointing device capable of inputting and outputting to and from the control unit 20, or a user interface such as a sound input unit. For the operation unit 25, a touch panel of the display unit 24 or a physical button provided on a housing may be used. The operation unit 25 notifies the control unit 20 of operation information by the user.

The imaging unit 26 outputs a captured image obtained using an imaging element. The control unit 20 can acquire an image captured by the imaging element of the imaging unit 26 at an optional timing.

Figure 3:
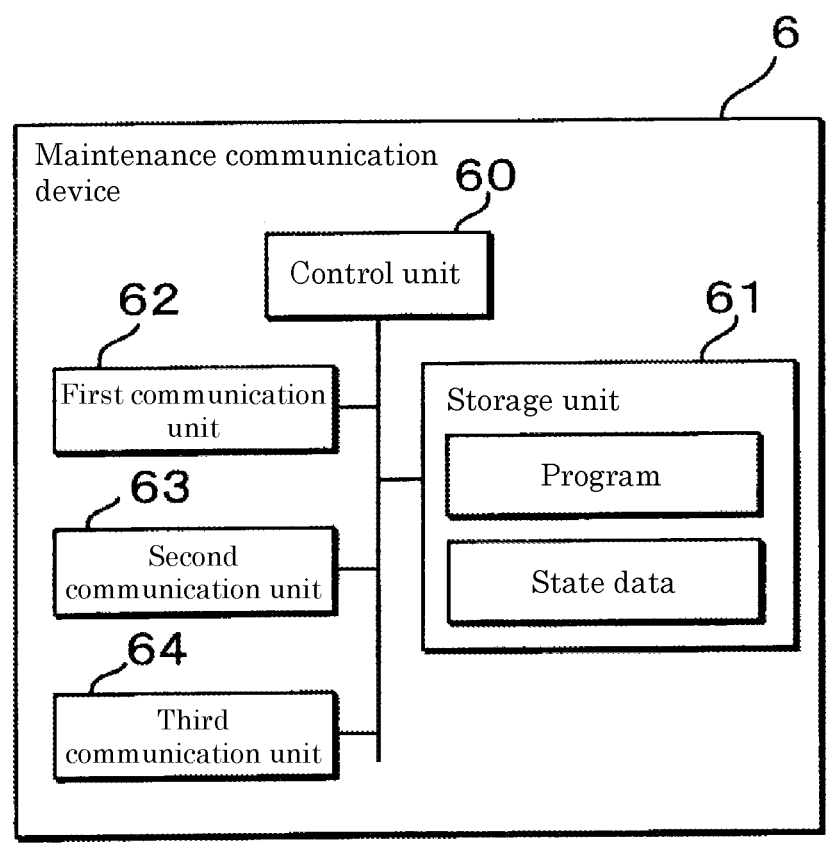
FIG. 3 is a block diagram illustrating an internal configuration of maintenance equipment.

FIG. 3 is a block diagram illustrating an internal configuration of the maintenance communication device 6. The maintenance communication device 6 includes a control unit 60, a storage unit 61, a first communication unit 62, a second communication unit 63, and a third communication unit 64. The control unit 60 uses a CPU or a microprocessor. The storage unit 61 stores a program specified in advance.

The storage unit 61 is a non-volatile memory such as a flash memory. The storage unit 61 stores state data received from the energy storage device 50.

The first communication unit 62 is a communication device that realizes communication connection with a unit connected to the energy storage device 50. In the present embodiment, the first communication unit 62 is communicably connected to a unit of the energy storage device by wireless communication by Bluetooth (registered trademark) or the like.

The second communication unit 63 is a communication device that realizes communication connection via the network CN. The maintenance communication device 6 can transmit state data received from the energy storage device 50 to the management apparatus 51 by the second communication unit 63. In a case where the energy storage device 50 includes a battery management device having a communication function, the second communication unit 63 is unnecessary.

The third communication unit 64 is a communication device that realizes communication connection between the maintenance communication device 6 and the maintenance terminal device 2. In the present embodiment, the third communication unit 64 is a USB interface. The third communication unit 64 may be a wireless communication device different from the first communication unit 62.

The control unit 60 of the maintenance communication device 6 periodically acquires state data from the energy storage device 50 by the first communication unit 62 based on a program, and sequentially stores the acquired state data in the storage unit 61. A storage cycle is, for example, about once a day. The control unit 60 stores date and time of acquisition in the storage unit 61 in association with the state data. The control unit 60 sequentially transmits the acquired state data from the second communication unit 63 to the management apparatus 51. In a case where the control unit 60 is communicatively connected to the maintenance terminal device 2 by the third communication unit 64 based on the program, the control unit 60 reads state data from the storage unit 61 in response to an instruction from the maintenance terminal device 2 and transmits the state data from the third communication unit 64.

State data accumulated in the maintenance communication device 6 is acquired by the maintenance terminal device 2 possessed by a person in charge of maintenance at the time of performing periodic maintenance inspection, and is transmitted to the maintenance support device 1 via the network MN or the communication network N. The state data transmitted at this time may include an appearance image of the energy storage device 50 captured by the imaging unit 26 of the maintenance terminal device 2 at the time of maintenance inspection. The state data is aggregated in the remote monitoring system 300. As described, state data that is not transmitted to the remote monitoring system 300 via the network CN of a customer can also be aggregated by remote monitoring system 300.

Figure 4:
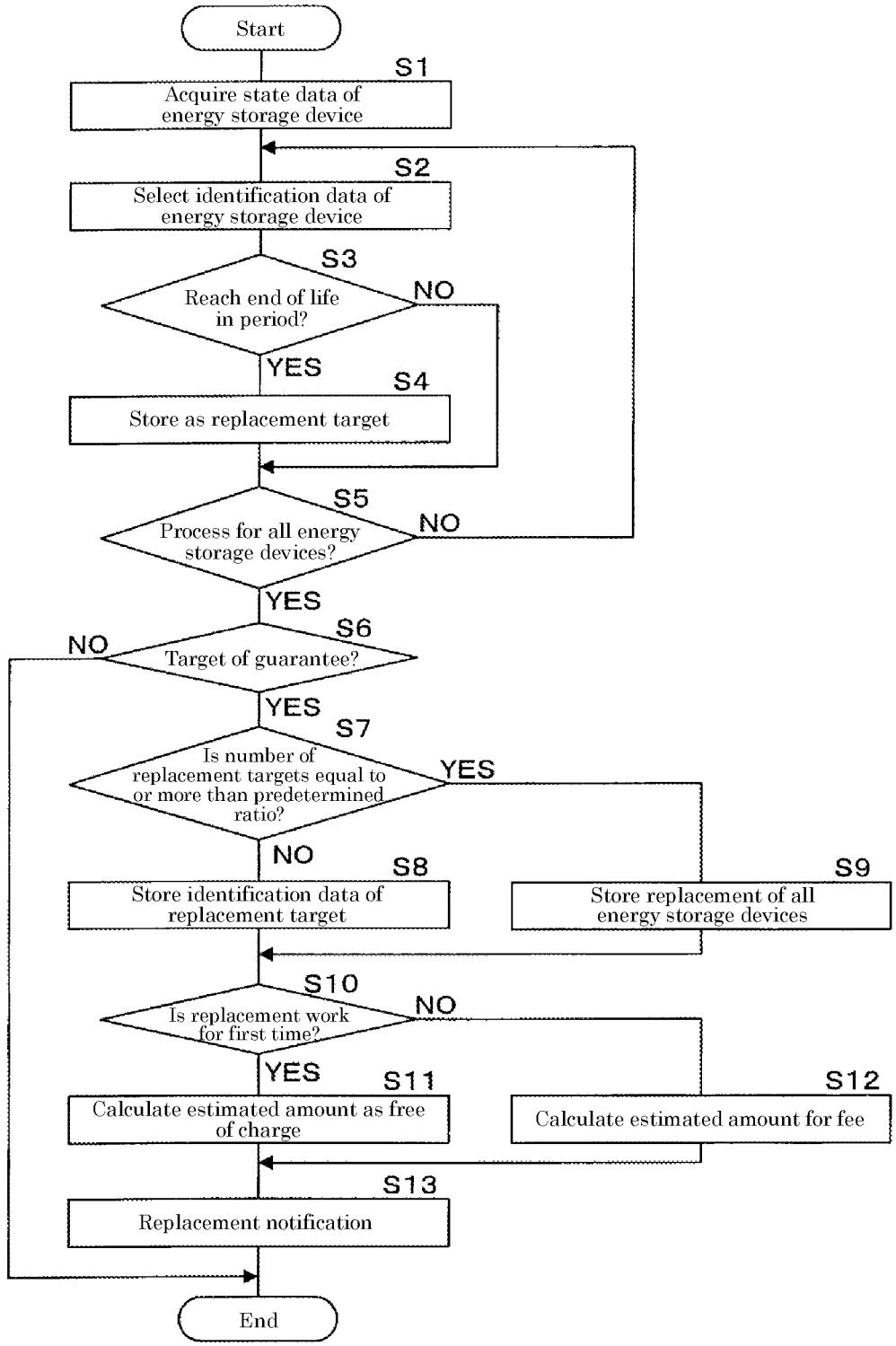
FIG. 4 is a flowchart illustrating an example of a processing procedure in a maintenance support device.

In the maintenance support system 100 of the present embodiment, a replacement time is determined using the state data directly acquired by the maintenance support device 1 from the maintenance communication device 6 or the state data acquired from the remote monitoring system 300. FIG. 4 is a flowchart illustrating an example of a processing procedure in the maintenance support device 1. The control unit 10 of the maintenance support device 1 performs the processing procedure of FIG. 4 at a frequency of about one to two times per year for each of assembled batteries in which a plurality of the energy storage devices 50 delivered at the same time are connected, for example, for each of the energy storage apparatuses 5. The control unit 10 may collectively perform the processing on a group of the energy storage devices 50 which are delivered to the same customer on a large scale and are operated in different places at the same time.

For an assembled battery including the target energy storage device 50, the control unit 10 acquires state data measured once a day in a target period from after implementation of the processing previous time to the latest of the energy storage device 50 (Step S1). The acquisition may be performed from the maintenance communication device 6 as described above, or may be performed from the remote monitoring system 300. The acquired data is of about one year or half a year in the example of FIG. 4. The control unit 10 selects one piece of identification data of a battery cell (the energy storage device 50) of a lead-acid battery (Step S2).

Based on the state data in the target period, the control unit 10 determines whether or not the energy storage device 50 identified by the selected identification data reaches the end of its life within a guaranteed period (Step S3). The determination in Step S3 corresponds to a "second determination unit". Details of the determination processing will be described later.

In a case where it is determined that the end of its life is to be reached (S3: YES), the control unit 10 stores the energy storage device 50 of the selected identification data as a replacement target (Step S4) even if the end of the life is not reached at the present time, and advances the processing to next Step S5.

In a case where it is determined that the end of its life is not to be reached (S3: NO), the control unit 10 advances the processing to next Step S5.

The control unit 10 determines whether or not the determination processing has been performed for all the energy storage devices 50 included in the target assembled battery (Step S5). When it is determined that the processing has not been performed on all the energy storage devices 50 (S5: NO), the control unit 10 returns the processing to Step S2.

In a case where it is determined that the processing has been performed on all the energy storage devices 50 (S5: YES), the control unit 10 determines whether or not the target assembled battery is a target of guarantee (Step S6).

The determination as to whether or not the target assembled battery is a guarantee target in Step S6 includes a determination as to whether or not state data in the target period is stored in the maintenance communication device 6 or the remote monitoring system 300 and can be acquired. The determination in Step S6 corresponds to a "first determination unit". The determination as to whether or not the target assembled battery is a target of guarantee includes determination as to whether or not it is possible to check that guarantee money has been paid for the target assembled battery on the customer data management system 400. Another condition may be set for the determination as to whether or not the target assembled battery is a target of guarantee. For example, in a case where a temperature included in the acquired state data is a temperature (for example, 40° C.) at which it can be determined that a use environment cannot be guaranteed as the use environment, it may be determined that the target assembled battery is not a target of guarantee.

In a case where it is determined that the target assembled battery is a target of guarantee (S6: YES), the control unit 10 determines whether or not a ratio of the number of the energy storage devices 50 determined to reach the end of its life in Step S4 to the number of all the energy storage devices 50 included in the assembled battery is a predetermined ratio or more (Step S7). The determination in Step S7 corresponds to a "third determination unit".

In a case where it is determined that the ratio is not the predetermined ratio or more (S7: NO), the control unit 10 determines that the energy storage device 50 stored as a replacement target needs to be replaced, and stores the energy storage device 50 together with identification data for identifying the energy storage device 50 (Step S8). The control unit 10 advances the processing to next Step S10.

In a case where it is determined in Step S7 that the ratio is the predetermined ratio or more (S7: YES), the control unit 10 determines that all the energy storage devices 50 of the target assembled battery (energy storage apparatus 5) need to be replaced, and stores replacement of all (Step S9).

The control unit 10 determines from the customer data management system 400 whether or not replacement work is within a guarantee period from a delivery date and for the first time (Step S10), and, in a case where the replacement work is within the guarantee period and for the first time, the control unit 10 calculates an estimated amount of replacement as free of charge (Step S11).

In a case where it is determined in Step S11 that the replacement work is not performed within the guarantee period or for the first time (S10: NO), the control unit 10 calculates an estimated amount of replacement as replacement for a fee (Step S12).

The control unit 10 notifies an owner of the assembled battery (the energy storage apparatus 5) and a person in charge of maintenance of a replacement notification for the energy storage device 50 stored as a replacement target together with the calculated replacement estimate amount (Step S13), and ends the processing.

When the assembled battery is determined not to be a target of guarantee in Step S6 (S6: NO), the assembled battery is not covered by the guarantee. Therefore, the control unit 10 may end the process without further progress, or may end the processing after notifying a person in charge of maintenance of a replacement notification for the energy storage device 50 which is determined to reach the end of its life.

In this manner, with respect to an assembled battery which is set as a target of guarantee by payment of guarantee money, during the guarantee period, replacement work of the energy storage devices 50 is not performed every time each of the energy storage devices 50 reaches its life, but the energy storage devices 50 determined to reach its life can be collectively replaced so that work cost can be suppressed.

Figure 5:
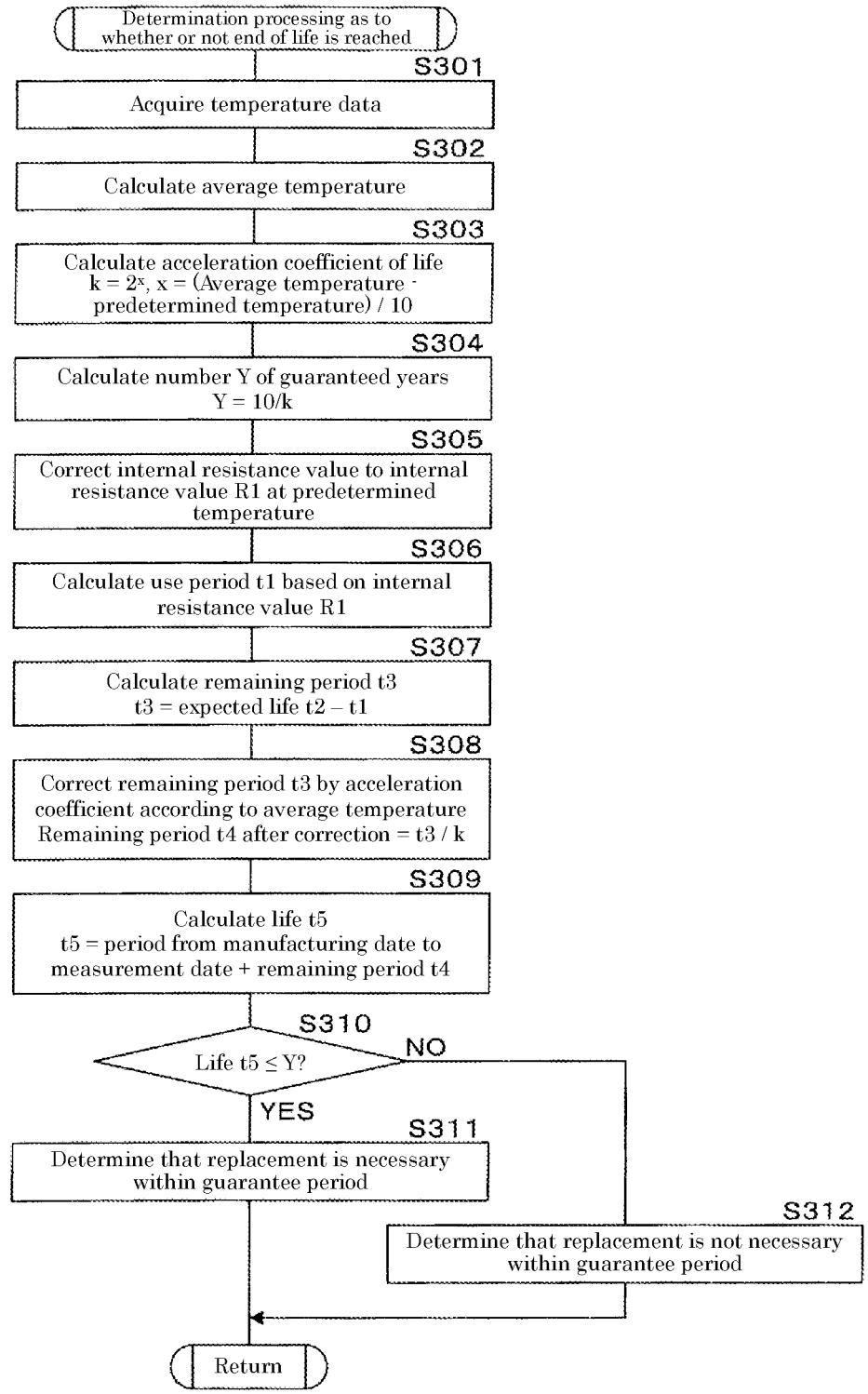
FIG. 5 is a flowchart illustrating an example of a processing procedure for determining whether or not each energy storage device reaches the end of its life.

FIG. 5 is a flowchart illustrating an example of a processing procedure for determining whether or not each of the energy storage devices 50 reaches the end of its life. FIG. 5 corresponds to details of Step S3 in the processing procedure illustrated in FIG. 4, and illustrates an example of determination processing for a lead-acid battery (the energy storage device 50). In a case where the energy storage device 50 is an energy storage device other than a lead-acid battery, the determination processing for each type is preferably used.

The control unit 10 acquires temperature data in a target period from acquired state data of the energy storage device 50 (Step S301), calculates an average temperature (Step S302), and a control unit 10 calculates an acceleration coefficient k of a life based on the average temperature (Step S303). The acceleration coefficient k is calculated by $k=2^x$ (2 raised to the power of x) and x=(average temperature−predetermined temperature)/10. The predetermined temperature is, for example, 25° C., and in a case where the average temperature is less than 25° C., that is, when x is a negative value, k=1 is always set.

The control unit 10 calculates the number Y of guaranteed years (=10/k) (Step S304). As an example, the number of guaranteed years is ten when the predetermined temperature is 25° C.

The control unit 10 calculates an internal resistance value R1 at the predetermined temperature (for example, 25° C.) from a latest internal resistance value in the target period in the acquired state data of the energy storage device 50 (Step S305).

Based on the calculated internal resistance value R1, the control unit 10 derives a use period t1 in a case of use at the predetermined temperature from a relationship of transition of an internal resistance value with respect to a use period in data accumulated in advance (Step S306).

The control unit 10 calculates a remaining period t3 to a life end by subtracting the use period t1 calculated in Step S306 from an expected life t2 of the target energy storage device 50 at the predetermined temperature (Step S307), and corrects the calculated remaining period t3 with the average temperature calculated in Step S302 (Step S308).

The control unit 10 calculates a life t5 obtained by adding a remaining period t4 (=t3/k) obtained by the correction, the number of days from a manufacturing date obtained from a production management system or the customer data management system 400 to a latest state data measurement date, and the number of days corrected with the average temperature calculated in Step S302 (Step S309).

The control unit 10 determines whether the life t5 calculated in Step S309 is equal to or less than the number Y of guaranteed years (Step S310). When it is determined that the life t5 is less than or equal to the number Y of guaranteed years (S310: YES), the control unit 10 determines that the target energy storage device 50 needs to be replaced within a guarantee period (Step S311), and returns the processing to Step S4 in FIG. 4.

In a case where the life t5 is determined to exceed the number Y of guaranteed years (S310: NO), the control unit 10 determines that replacement is unnecessary (Step S312), and returns the processing to Step S4 in FIG. 4.

As described above, the determination procedure for necessity of replacement illustrated in FIG. 5 shows a determination procedure for a lead-acid battery. In a case where the energy storage device 50 is an energy storage device other than a lead-acid battery, it is determined whether or not replacement is necessary within a guarantee period by another determination procedure.

As an example, the procedure shown in the flowcharts of FIGS. 4 and 5 will be specifically described for the energy storage apparatus 5 of a lead-acid battery including 60 of the energy storage devices 50 having the expected life t2 of 13 years.

In FIG. 5, in a case where the average temperature of the selected energy storage device 50 acquired in Step S301 is 25° C., the temperature is equal to the predetermined temperature 25° C., and the acceleration coefficient k is calculated to be "1" (S303). In Step S304, the number Y of guaranteed years is calculated as Y=10 in a case where k=1. In a case where the use period t1 is calculated to be nine years in Step S306 based on the internal resistance value R1 at the predetermined temperature of 25° C. corrected from an internal resistance value of the selected energy storage device 50, the remaining life t3 is calculated to be four years in Step S307 (t3=t2−t1=13−9). In a case where a period from a manufacturing date to a measurement date is five years, the life t5 is calculated to be nine years in Step S309 (t5=(5/k)+(4/k)=(5/1)+(4/1)=9). When k=1, the number of guaranteed years is calculated to be ten years (S303), and in this case, since nine years of the life t5 is less than ten years which is the number Y of guaranteed years, it is determined that the replacement is performed within the guarantee period (S311). In a case where the use period t1 is calculated to be ten years based on the internal resistance value R, the remaining life t3 is calculated to be three years and the life t5 is calculated to be eight years.

In the description with reference to FIG. 5, in Step S305, an internal resistance value at the predetermined temperature is calculated from an internal resistance value of the energy storage device 50, and a use period is estimated by applying the calculated internal resistance value to transition of an internal resistance value with respect to a use period in data accumulated in advance. The method of estimating a use period is not limited to the above. For example, conversely, transition of an internal resistance value with respect to a use period at the predetermined temperature accumulated in advance may be converted into transition in a case use at an average temperature in a use environment of the target energy storage device 50, an internal resistance value of the target energy storage device 50 may be applied to the transition after the conversion to determine to which period the internal resistance value corresponds, so as to estimate a use period. An accumulated internal resistance value may be converted into an internal resistance value at a temperature at which an internal resistance value of the energy storage device 50 is measured and applied. Furthermore, while a change in an internal resistance value is small, a use period may be a period obtained by correcting a period from a manufacturing date to a measurement date based on the average temperature.

Figure 6:
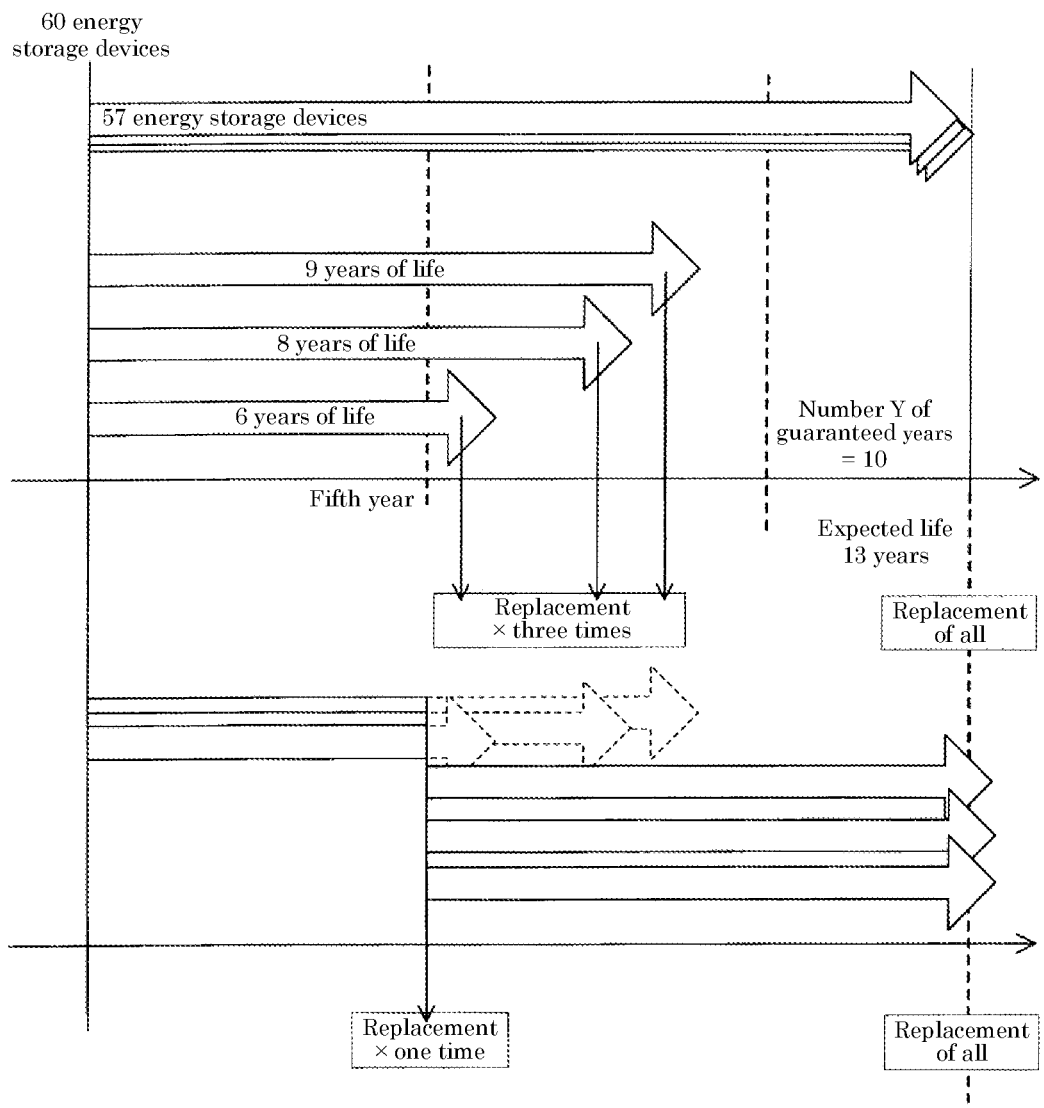
FIG. 6 illustrates an outline of replacement of an energy storage device in one example.

FIG. 6 illustrates an outline of replacement of the energy storage device 50 in the above example. As illustrated in FIG. 6, in a case where the number Y of guaranteed years obtained from state data acquired in a fifth year is calculated to be ten, the life t5 is calculated to be six, eight, and nine years, and it is assumed that three of the energy storage devices 50 having remaining lives of one to four years are determined to be required to be replaced. In this case, since it is determined that the number of the energy storage devices 50 determined to be required to be replaced is less than a predetermined ratio 10% (S7: NO), in the maintenance support system 100 of the present embodiment, replacement of three of the energy storage devices 50 determined to be required to be replaced is notified from the maintenance support device 1. With such a configuration, instead of performing replacement work three times in sixth, eighth, and ninth years for three of the energy storage devices 50, only one time of replacement work is required, and, even if all of them are to be replaced in 13th year, the number of times of the replacement work is suppressed for a customer, and the replacement is regarded as a guarantee target within the number Y of guaranteed years, so that maintenance cost can be suppressed.

A manufacturer of the energy storage device 50 does not need to take the risk of guaranteeing a case of use at an abnormal temperature, since the energy storage device 50 is set as a target of guarantee including free replacement in a case where a condition including acquisition of state data that is periodically measured is satisfied. In a case where the number of the energy storage devices 50 reaching the end of their lives within the number of guaranteed years according to a use environment is equal to or more than a predetermined ratio in an assembled battery, replacement of all is determined, and in a case where the number of the energy storage devices 50 reaching their lives within the number of guaranteed years is less than the predetermined ratio, replacement with a new battery is determined. In this manner, performance of the energy storage apparatus 5 as a whole can be maintained for a guarantee period exceeding ten years using the energy storage devices 50 having the same electrical characteristics. As described above, by the determination processing of the maintenance support device 1, when the user of the energy storage apparatus 5 and a manufacturer of the energy storage device 50 bear appropriate guarantee money and free replacement, the energy storage device 50 can be guaranteed for a long time.

The disclosed embodiments are illustrative in all respects and not restrictive. The scope of the present invention is defined by the claims, and includes meanings equivalent to the claims and all changes within the scope.

The invention claimed is:

1. A determination method comprising the steps of:
   determining whether or not measurement data relating to a plurality of energy storage devices included in a system is periodically stored in a storage device;
   determining whether or not each of the energy storage devices reaches end of its life within a period corresponding to a standard use period at a predetermined temperature based on acquired measurement data in a case where measurement data is determined to be stored, wherein the acquired measurement data includes average temperature data that the determination is, at least in part, based upon; and
   determining that replacement is necessary for an energy storage device that is determined to reach end of its life.

2. The determination method according to claim 1, further comprising:
   determining whether or not number of energy storage devices determined to reach end of their lives is equal to or more than a predetermined ratio of number of all energy storage devices included in the system;
   determining that replacement is necessary for the energy storage device determined to reach end of its life in a case where the number of energy storage devices determined to reach end of their lives is determined to be less than a predetermined ratio; and
   determining that replacement is necessary for all the energy storage devices included in the system in a case where the number of energy storage devices determined to reach end of their lives is determined to be equal to or more than the predetermined ratio.

3. The determination method according to claim 2, further comprising:
   determining whether or not the energy storage device reaches end of its life based on accumulated data related to transition of an internal resistance value in a use period of a lead-acid battery at a predetermined temperature by using an internal resistance value included in the measurement data, the energy storage device being a lead-acid battery.

4. The determination method according to claim 1, further comprising:
   determining whether or not the energy storage device reaches end of its life based on accumulated data related to transition of an internal resistance value in a use period of a lead-acid battery at a predetermined temperature by using an internal resistance value included in the measurement data, the energy storage device being a lead-acid battery.

5. The determination method according to claim 3, further comprising:
   deriving, in the second determining step and based on temperature data included in the measurement data, a use period up to a time point at which the measurement data of the lead-acid battery is acquired by converting an internal resistance value included in the measurement data into an internal resistance value at the predetermined temperature or converting transition of an internal resistance value in a use period of the lead-acid battery at the predetermined temperature into transition of an internal resistance value in the temperature data; and
   determining whether or not the energy storage device reaches end of its life based on a derived use period.

6. A determination device comprising:
   a first determination unit that determines whether or not measurement data relating to a plurality of energy storage devices included in a system is periodically stored in a storage device;
   a second determination unit that determines whether or not each of the energy storage devices reaches end of its life within a period corresponding to a standard use period at a predetermined temperature based on acquired measurement data in a case where measurement data is determined to be stored, wherein the acquired measurement data includes average temperature data that the determination is, at least in part, based upon; and a third determination unit that determines that replacement is necessary for an energy storage device that is determined to reach end of its life.

7. A maintenance support system comprising:

a storage device that periodically acquires and sequentially stores measurement data relating to an energy storage device included in a system;

a maintenance terminal device used by a maintenance worker of the energy storage device; and a maintenance support device to which communication connection can be established from the maintenance terminal device, wherein the maintenance support device:

determines whether or not measurement data relating to a plurality of energy storage devices included in the system is periodically stored in the storage device;

determines whether or not each of the energy storage devices reaches end of its life within a period corresponding to a standard use period at a predetermined temperature based on acquired measurement data in a case where measurement data is determined to be stored, wherein the acquired measurement data includes average temperature data that the determination is, at least in part, based upon;

determines that replacement is necessary for an energy storage device which is determined to reach end of its life; and notifies the maintenance terminal device of a determination result.

8. A computer program product, stored on a non-transitory computer storage medium comprising instructions that, when executed by one or more processors, cause processing of:

determining whether or not measurement data relating to a plurality of energy storage devices included in a system is periodically stored in a storage device;

determining whether or not each of the energy storage devices reaches end of its life within a period corresponding to a standard use period at a predetermined temperature based on acquired measurement data in a case where measurement data is determined to be stored, wherein the acquired measurement data includes average temperature data that the determination is, at least in part, based upon; and determining that replacement is necessary for an energy storage device that is determined to reach its life.

9. A determination method comprising the steps of:

determining whether or not measurement data relating to a plurality of energy storage devices included in a system is periodically stored in a storage device;

determining whether or not each of the energy storage devices reaches end of its life within a period corresponding to a standard use period at a predetermined temperature based on acquired measurement data in a case where measurement data is determined to be stored, the acquired measurement data including an internal resistance value that the determination is, at least in part, based upon; and determining that replacement is necessary for an energy storage device that is determined to reach end of its life;

deriving, in the second determining step and based on temperature data included in the measurement data, a use period up to a time point at which the measurement data of the energy storage device is acquired by converting an internal resistance value included in the measurement data into an internal resistance value at the predetermined temperature or converting transition of an internal resistance value in a use period of the energy storage device at the predetermined temperature into transition of an internal resistance value in the temperature data; and further determining whether or not the energy storage device reaches end of its life based on the derived use period.

* * * * *